United States Patent [19]
Kobayashi et al.

[11] Patent Number: 5,760,425
[45] Date of Patent: Jun. 2, 1998

[54] INTERNAL COMPRESSION BONDED SEMICONDUCTOR DEVICE WITH A CHIP FRAME ENABLING A LONGER CREEPAGE DISTANCE

[75] Inventors: Ikuko Kobayashi, Kawasaki; Michiaki Hiyoshi, Yokohama, both of Japan

[73] Assignee: Kabushiki Kaisha Toshiba, Kawasaki, Japan

[21] Appl. No.: 790,457

[22] Filed: Jan. 29, 1997

[30] Foreign Application Priority Data

Jan. 30, 1996 [JP] Japan .................. 8-014412

[51] Int. Cl.$^6$ .................. H01L 29/74; H01L 31/111
[52] U.S. Cl. .................. 257/181; 257/688; 257/180
[58] Field of Search .................. 257/688, 127, 257/150, 177, 170, 180, 181

[56] References Cited

U.S. PATENT DOCUMENTS

| | | | |
|---|---|---|---|
| 4,642,671 | 2/1987 | Rohsler et al. | 257/688 |
| 5,278,434 | 1/1994 | Niwayama | 257/181 |
| 5,641,976 | 6/1997 | Taguchi et al. | 257/181 |

FOREIGN PATENT DOCUMENTS

| | | |
|---|---|---|
| 0 512 742 | 11/1992 | European Pat. Off. . |
| 2 083 557 | 12/1971 | France . |
| 25 41 971 | 3/1977 | Germany . |
| 32 38 557 | 4/1984 | Germany . |

OTHER PUBLICATIONS

Patent Abstracts of Japan, vol. 013, No. 240 (E–767), Jun. 6, 1989, JP 01 042843, Feb. 15, 1989.
Patent Abstracts of Japan, vol. 009, No. 248 (E–347), Oct. 4, 1985, JP 60 097672, May 31, 1985.

Primary Examiner—Mahshid D. Saadat
Assistant Examiner—S. V. Clark
Attorney, Agent, or Firm—Oblon, Spivak, McClelland, Maier & Neustadt, P.C.

[57] ABSTRACT

The top-side (n-type) electrode and bottom-side (p-type) electrode of a Si chip with a p-n junction are pressed against a Cu cathode electrode and a Cu anode electrode via Mo plates respectively, thereby establishing electrical connection. The inner wall of a case is round and the Si chip is almost square. The top of the case is covered with ceramic, for example. A washer is a compression member. A chip frame holds the Si chip and Mo plates in compression positions and simultaneously determines their locations within the case. Specifically, the side face of the Si chip is not flush with the side face of each of the Mo plates. This enables the chip frame to make the creepage distance longer. Since the chip frame is a single chip frame without any joint, the creepage distance between the anode and cathode electrodes is defined by part of the chip frame that faces part of the surface of the Si chip and parts of the surfaces of the Mo plates sandwiching the Si chip between them.

20 Claims, 2 Drawing Sheets

INTERNAL COMPRESSION BONDED SEMICONDUCTOR DEVICE WITH A CHIP FRAME ENABLING A LONGER CREEPAGE DISTANCE

BACKGROUND OF THE INVENTION

This invention relates to a power semiconductor device, and more particularly to an internal compression bonded semiconductor device, such as a semiconductor rectifier diode.

A semiconductor rectifier diode is such that a p-n junction formed from, for example, silicon, is sealed in a case for the purpose of rectification. Semiconductor rectifier diodes with various capacities have been manufactured: for example, their rated current ranges from 0.1 to 3000 A and their rated voltage ranges from 1000 to 6000 V. According to the capacity, various types of cases, including a lead-mount type, flat type, and stud type, have been used.

In general, with a stud-type Si rectifier diode, an electrode on one side and an electrode on the opposite side of an Si chip with a p-n junction are pressed against a Cu cathode electrode and a Cu anode electrode, respectively, each via a Mo plate, thereby establishing electrical connection. The Mo plates function as heat buffer plates that prevent distortion due to the difference in thermal coefficient between Si and Cu. One side of the Si chip is of the n-type and is electrically connected to the cathode electrode side and the other side is of the p-type and is electrically connected to the anode electrode side.

Such a chip is as thin as 400 to 500 μm and requires suitable uniform compression. To meet this requirement, a chip frame for holding a Si chip in place and a guide frame for securing the Si chip-mounted chip frame in the correct place and guiding and positioning the Mo plate are provided as component parts for positioning the Si chip within the case. Specifically, in the guide frame, a quadrilateral opening into which a chip frame is fitted is made. Both of the chip frame and guide frame are insulating members.

After the Si chip has been bonded to the chip frame with an adhesive to increase its pressure resistance, tests are done on the chip to evaluate the characteristics of the product. The evaluated chip, together with the chip frame, is fitted into the guide frame. The Si chip, together with the chip frame and guide frame, is housed in a case.

As described above, in a conventional semiconductor device, the chip frame and guide frame are separate component parts. The reason for such a configuration is that manufacture semiconductor devices having different current ratings or case sizes are manufactured by using Si chips complying with a single standard. By making a plurality of openings in a guide frame, a plurality of Si chips with chip frames of the same ratings can be fitted into the openings, thereby compressing the Si chips in parallel. This makes it possible not only to offer good-quality Si chips at low cost but also to form a semiconductor device with a large current rating.

When a semiconductor device is composed of a single Si chip, however, the configuration where the chip frame and guide frame are separate has a manufacturing cost problem: the number of component parts is great.

Furthermore, with a semiconductor device with a large voltage rating using such a thin Si chip, a very large voltage difference is applied between the electrodes or heat buffer plates facing each other with a short distance between them. Thus, after long hours of use, there is a possibility that current leakage or breakdown will take place due to electrical discharge. The chip frame and guide frame are provided as insulating material between the anode electrode and cathode electrode. The chip frame and guide frame have surface portions that face part of the surface of the Si chip and parts of the heat buffer plates (Mo plates) that sandwich the Si chip between them. When a creepage distance is considered, there is a joint of the chip frame and guide frame between the anode electrode and cathode electrode. That is, the distance along the external periphery of the chip frame is the shortest creepage distance.

To make the creepage distance longer, the Mo plate acting as a heat buffer plate was made thicker in the prior art. This prevented the aforesaid electrical discharge occurred after long hours of use. The thicker Mo plate, however, made it impossible to decrease the thermal resistance, thus failing to dissipate the heat generated at the p-n junction sufficiently. In the case of a semiconductor device with a high rated voltage, when the Mo plate is made thicker to secure the creepage distance, a heat dissipation problem becomes serious.

As described above, the conventional internal compression bonded semiconductor device has a chip frame and a guide frame separate from each other, which leads to a large number of component parts, leaving room for improvement in terms of cost. Furthermore, to increase the reliability, it is necessary to make the heat buffer plate thicker to increase the creepage distance, which increases the thermal resistance of the heat buffer plate, causing the problem of preventing the heat generated within the semiconductor device from dissipating sufficiently.

BRIEF SUMMARY OF THE INVENTION

The object of the present invention is to provide an internal compressing bonded semiconductor device which has a smaller number of component parts and a structure enabling the creepage distance to be made longer regardless of the thickness of a heat buffer plate, and makes it possible to reduce the thermal resistance of the heat buffer plate by making the buffer plate thinner.

The foregoing object is accomplished by providing an internal compression bonded semiconductor device which houses a semiconductor chip between two electrodes in a case and presses the chip against the electrodes, comprising: a first conducting plate provided between one of the two electrodes and the semiconductor chip; a second conducting plate provided between the other of the two electrodes and the semiconductor chip; and an insulating chip frame which is provided so as to extend from the periphery of the semiconductor chip toward the inner wall of the case and which positions the semiconductor chip, the first conducting plate, and the second conducting plate with specific distances from the inner wall of the case.

With the present invention, use of a single chip frame enables the semiconductor chip and the first and second conducting plates to be housed with a specific distance away from the inner wall of the case, reducing the number of component parts used. Because the chip frame is a single chip frame without any joint, the shortest creepage distance between the first and second electrodes is defined by surface portions of the chip frame that face part of the surface of the semiconductor chip and parts of the surfaces of the first and second conducting plates sandwiching the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
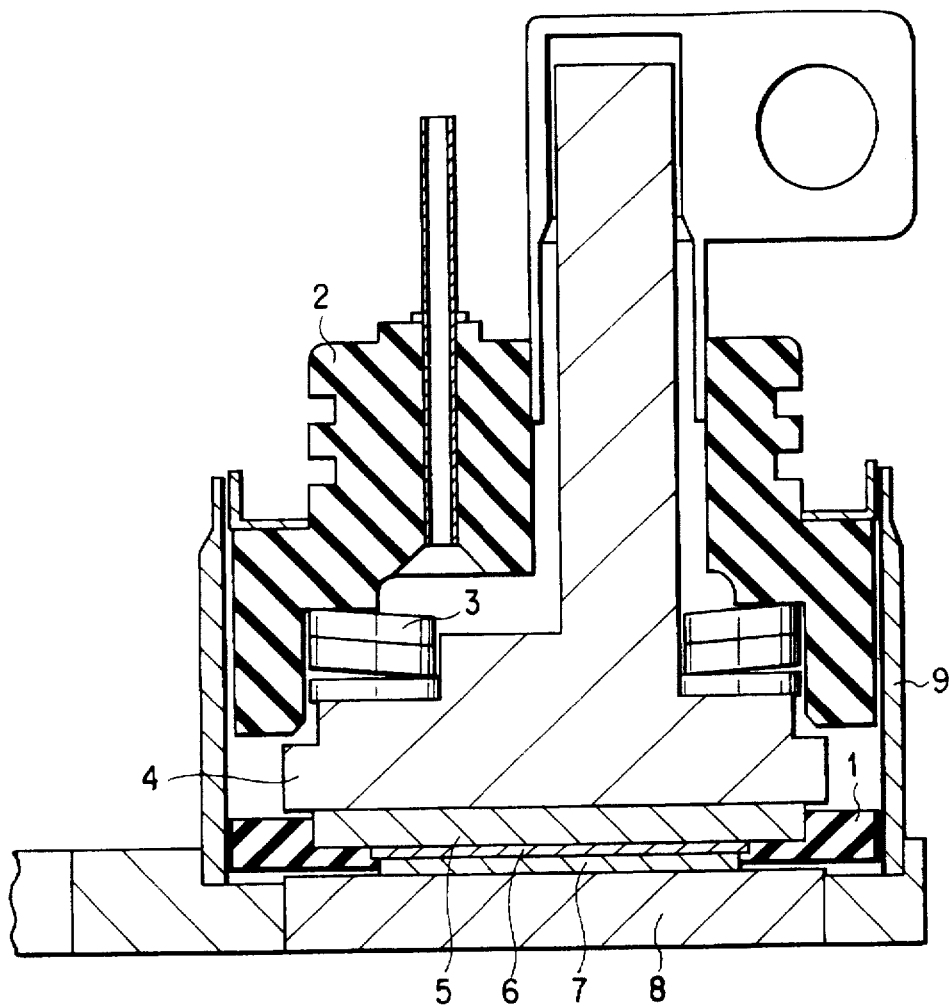
FIG. 1 is a sectional view of an internal compression bonded semiconductor device according to an embodiment of the present invention.

FIG. 1 is a sectional view of a stud-type Si rectifier diode according to a first embodiment of the present invention. One side (the top side) and the other side (the opposite side or the bottom side) of an Si chip with a p-n junction are pressed against a Cu cathode electrode 4 and a Cu anode electrode 8 via Mo plates 5 and 7, respectively, thereby establishing electrical connection. The Mo plates 5 and 7 function as heat buffer plates that prevent distortion due to the difference in thermal coefficient between Si and Cu. The figure shows a structure where the Si chip 6 is put in a forward direction, with the top side of the Si chip 6 being of the n-type and the bottom side being of the p-type. The inner wall of a case 9 is round and the Si chip 6 is almost square. The top of the case 9 is covered with ceramic 2, for example. A washer 3 is a compression member.

In the present invention, a chip frame 1 holds the Si chip 6 and Mo plates 5 and 7 in compression bonding places and simultaneously determines their locations with the case 9. Namely, the chip frame 1 has a structure into which a chip frame and a guide frame, which were separate from each other in the prior art, have been formed integrally. The chip frame 1 is formed of an insulating material, such as resin.

The side face of the Si chip 6 is not flush with each of the side faces of the Mo plates 5 and 7. As a result, the creepage distance is longer because of the chip frame 1. That is, because the chip frame 1 is a single chip frame without any joint, the creepage distance between the anode and cathode electrodes is defined by part of the chip frame 1 that faces part of the surface of the Si chip 6 and parts of the surfaces of the Mo plates chip sandwiching the Si chip 6 between them. More specifically, one side of the Si chip 6 is in contact with the main surface of the Mo plate 5, the other side of the Si chip 6 is in contact with the main surface of the Mo plate 7, and the creepage distance is produced in such a manner that part of the side face and part of the main surface of the Mo plate 5, the side face and part of the other side of the Si chip 6, and part of the side face of the Mo plate 7 face the inside surface portion of the chip frame 1. Therefore, unlike a conventional equivalent, the chip frame 1 of the present invention has a structure very favorable for the suppression of electrical discharge with time between electrodes.

Figure 2A:
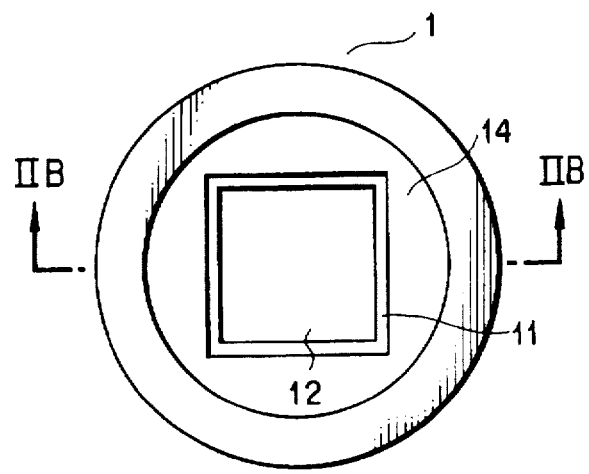
FIG. 2A is a top view of a chip frame used for the internal compression bonded semiconductor device of the present invention.
Figure 2B:
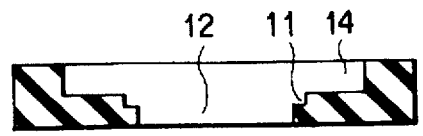
FIG 2B is a sectional view taken along line 2B—2B of FIG. 2A.

FIG. 2A is a top view of a chip frame associated with the present invention. FIG. 2B is a sectional view taken along line 2B—2B of FIG. 2A. A case where the inner wall of the case 9 is round and a Si chip housed in it is almost square will be described. The chip frame 1 is round so as to fit in the inner wall of the case 9. The chip frame has three different cutaway sections in the direction of thickness. For example, the chip frame has a quadrilateral cutaway section 11 for holding the Si chip 6 in the middle in the direction of thickness. A quadrilateral cutaway section 12 for holding the Mo plate 7 contacting the surface of the p-type side of the Si chip 6 is made in one surface of the chip frame so as to penetrate the cutaway section 11. Furthermore, in the surface of the opposite side of the chip frame, for example, a cutaway section 14 for holding the Mo plate 5 touching the surface of the n-type side of the Si chip 6 is made so as to penetrate the cutaway section 11.

Such a structure enables the chip frame 1 not only to hold the Si chip and the heat buffer plates 5 and 7, or the Mo plates, but also to determine their locations within the case 9. As a result, this structure helps reduce the number of component parts used, as compared with a conventional structure using a chip frame and a guide frame.

Furthermore, the insulating chip frame 1 is provided between the Mo plate 5 and electrode 8 or between the electrode 4 and electrode 8, which face each other with a large potential difference between them. The Mo plate 5 or electrodes 4 and 8 to the inner wall of the case 9 are formed integrally. The integral formation makes the creepage distance longer as described earlier. Specifically, the Mo plate has one main surface and the other main surface, with the whole of one main surface in contact with the electrode 4 and the other main surface except for part of it in contact with the Si chip 6. The part of the other main surface of the Mo plate 5 faces the surface of the chip frame 1 in a manner that comes into contact with each other. The distance over which the two surfaces face each other forms part of the creepage distance and plays a major role in lengthening the creepage distance. It is desirable that part of the creepage distance should be greater than at least the thickness of the Mo plate 7. This helps make the Mo plate 7 thinner remarkably than in the prior art.

In the prior art, since a chip frame and a guide frame were provided between the Mo plate 5 or electrodes 4, 8 and case 9, there was a possibility that a current path would develop along the joint between the chip frame and guide frame, which made it impossible to produce a longer creepage distance. To overcome the shortcoming, the creepage distance between the Mo plate 5 and electrode 8 was secured by making the Mo plate 7 thicker, thereby improving the reliability. With the present embodiment, however, use of the chip frame 1 enables the creepage distance between the Mo plate 5 and electrode to be made longer. As a result, of the electrodes facing each other, it is the distance between the electrode 4 and case 9 (the case 9 has the same potential as that of the electrode 8) that has the shortest creepage distance. The distance between the electrode 4 and case 9 is guaranteed from the beginning. For this reason, the creepage distance between the electrodes 4 and 8 should be made longer than the distance between the electrode 4 and case 9. This eliminates the need of making the Mo plate 7 thicker to the extent that the thickness of the Mo plate has an adverse effect on the reduction of the thermal resistance of the product.

Figure 3:
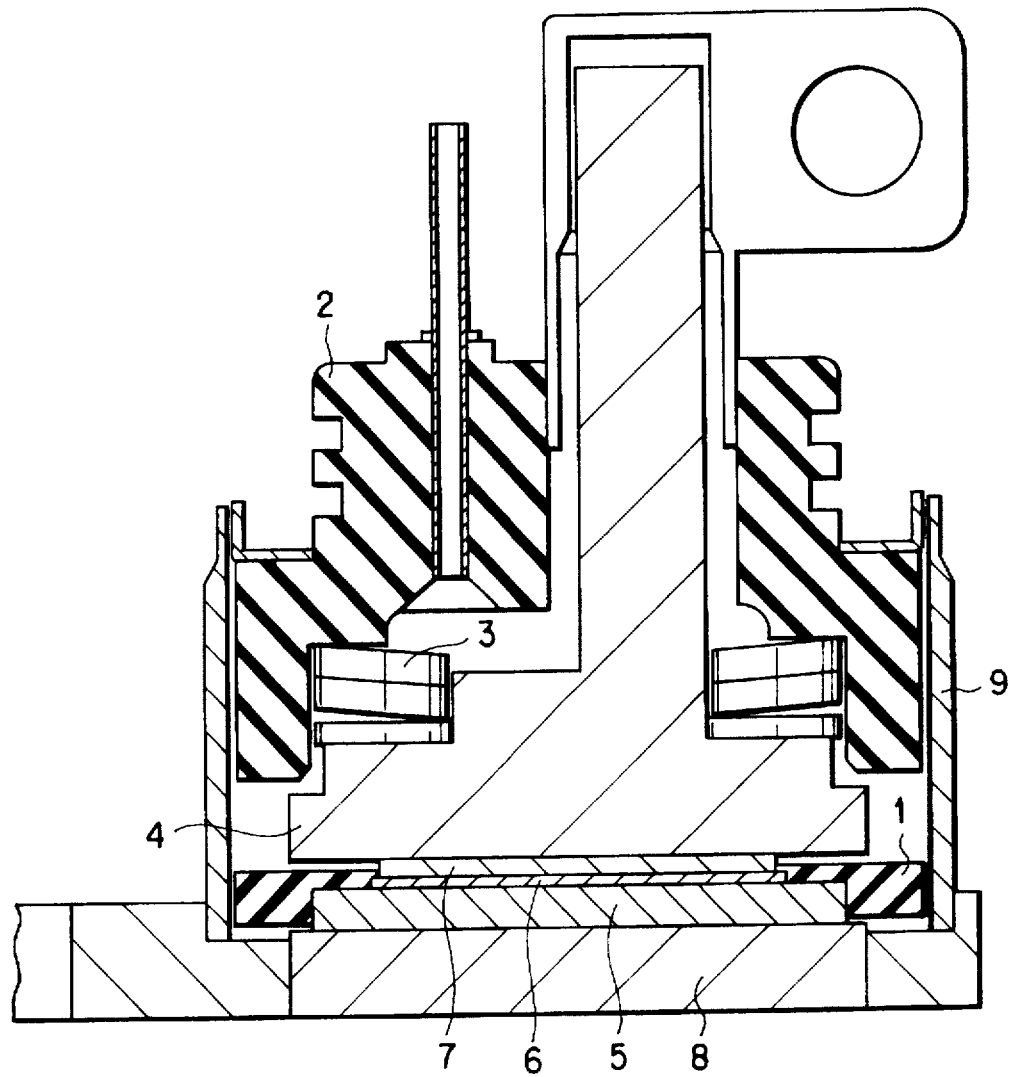
FIG. 3 is a sectional view of an internal compression bonded semiconductor device according to another embodiment of the present invention.

While in the embodiment, the case where the Si chip 6 has been put in a forward direction, the Si chip 6 can be put in the reverse direction by reversing the chip frame 1 (FIG. 3).

Although the present invention has been explained taking a stud-type Si rectifier diode as example, it is not limited to this. For instance, the invention may be applied to an internal compression bonded semiconductor device with another type of case, such as a flat-type case. In this case, a chip frame 1 must be manufactured according to the shape of the case. Since a guide frame had to be manufactured according to the shape of the case in the prior art, an internal compression bonded semiconductor device with another type of case can be manufactured at a similar manufacturing cost to that of a conventional equivalent. Unlike a conventional equivalent, a semiconductor device of the present invention uses only a single chip frame 1 and therefore can be manufactured at low cost. It is desirable that the present invention should be applied to an internal compression bonded semiconductor device particularly composed of a single Si chip which is not required for separate inspection.

As described so far, with an internal compression bonded semiconductor device of the present invention, the number of component parts can be reduced. Furthermore, since the reliability can be improved by making the creepage distance larger without being affected by the thickness of the heat buffer plate, the thermal resistance of the heat buffer plate can be decreased by making the buffer plate thinner.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

We claim:

1. An internal compression bonded semiconductor device which houses a semiconductor chip between two electrodes in a case and presses the chip against the electrodes, comprising:

a first conducting plate provided between one of said two electrodes and said semiconductor chip;

a second conducting plate provided between the other of said two electrodes and said semiconductor chip; and an insulating chip frame which is provided so as to extend from the periphery of said semiconductor chip toward the inner wall of said case and which positions said semiconductor chip, said first conducting plate, and said second conducting plate with specific distances from the inner wall of said case, the creepage distance between said two electrodes being defined by surface portions of said chip frame that faces part of the surface of said Si chip and each of parts of the surfaces of said first conducting plate and said second conducting plate.

2. An internal compression bonded semiconductor device according to claim 1, wherein said first conducting plate and said second conducting plate function as heat buffer plates.

3. An internal compression bonded semiconductor device according to claim 1, wherein said first conducting plate has one main surface and the other main surface, with the whole of said one main surface being in contact with one of said two electrodes and said other main surface except for part of it being in contact with said semiconductor chip.

4. An internal compression bonded semiconductor device according to claim 3, wherein the part of said other main surface of said first conducting plate faces the surface of said chip frame in a manner that comes into contact with the latter and forms part of said creepage distance.

5. An internal compression bonded semiconductor device according to claim 4, wherein the part of said creepage distance is greater than the thickness of said second conducting plate.

6. An internal compression bonded semiconductor device according to claim 1, wherein said second conducting plate has one main surface and the other main surface, with the whole of said one main surface being in contact with the other of said two electrodes and the whole of said other main surface being in contact with said semiconductor chip.

7. An internal compression bonded semiconductor device according to claim 1, wherein the creepage distance between said two electrodes is larger than the distance from the inner wall of said case to the closer one of said two electrodes.

8. An internal compression bonded semiconductor device according to claim 1, wherein said semiconductor chip has one main surface and the other main surface, said one main surface containing n-type impurities and said other main surface containing p-type impurities, and one of said first and second conducting plates that is in contact with said other main surface being thinner than one of said first and second conducting plates that is in contact with said one main surface.

9. An internal compression bonded semiconductor device according to claim 1, wherein said first conducting plate has one main surface, the other main surface, and the side face, said second conducting plate has one main surface, the other surface, and the side face, and said semiconductor chip has one main surface, the other main surface, and the side face, one main surface of said semiconductor chip being in contact with the other main surface of said first conducting plate, the other main surface of said semiconductor chip being in contact with the other main surface of said second conducting plate, and said creepage distance being produced in such a manner that part of the side face and part of the other main surface of said first conducting plate, the side face and part of the other main surface of said semiconductor chip, and part of the side face of said second conducting plate face the surface of said chip frame.

10. An internal compression bonded semiconductor device according to claim 9, wherein said chip frame has three cutaway sections of different shapes in the direction of thickness, the cutaway sections being composed of a first cutaway section that fits on the side face of said first conducting plate, a second cutaway section that fits on the side face of said semiconductor chip, and a third cutaway section that fits on the side face of said second conducting plate.

11. An internal compression bonded semiconductor device according to claim 10, wherein the peripheral shape of said chip frame is formed so as to fit in the inner wall of said case.

12. An internal compression bonded semiconductor device comprising:

a semiconductor chip;

a first heat buffer plate in contact with one main surface of said semiconductor chip;

a second heat buffer plate in contact with the other main surface of said semiconductor chip;

a first electrode facing said semiconductor chip via said first heat buffer plate;

a second electrode facing said semiconductor chip via said second heat buffer plate;

a case that houses said semiconductor chip, said first heat buffer plate, said second heat buffer plate, said first electrode, and said second electrode; and an insulating chip frame provided around said semiconductor chip so that said semiconductor chip, said first heat buffer plate, and said second heat buffer plate may be positioned a specific distance away from the inner wall of said case, the creepage distance between said first electrode and said second electrode being defined by surface portions of said chip frame that face part of the surface of said Si chip and each of parts of the surfaces of said first heat buffer plate and second heat buffer plate.

13. An internal compression bonded semiconductor device according to claim 12, wherein the creepage distance between said first electrode and said second electrode is larger than the distance from the inner wall of said case to the closer one of said first and second electrodes.

14. An internal compression bonded semiconductor device according to claim 12, wherein one main surface of said semiconductor chip contains n-type impurities and the other main surface of said semiconductor chip contains p-type impurities and said second heat buffer plate is thinner than said first heat buffer plate.

15. An internal compression bonded semiconductor device according to claim 12 or 14, wherein said first heat buffer plate has one main surface and the other main surface, with the whole of said one main surface being in contact with said first electrode and said other main surface except for part of it being in contact with said semiconductor chip, and the part of said other main surface facing the surface of said chip frame in a manner that comes into contact with the latter and forming part of said creepage distance.

16. An internal compression bonded semiconductor device according to claim 15, wherein the part of said creepage distance is greater than the thickness of said second heat buffer plate.

17. An internal compression bonded semiconductor device according to claim 12, wherein said second heat buffer plate has one main surface and the other main surface, with the whole of said one main surface being in contact with said second electrode and the whole of said other main surface being in contact with said semiconductor chip.

18. An internal compression bonded semiconductor device according to claim 12, wherein said first buffer plate has one main surface, the other main surface, and the side face, said second buffer plate has one main surface, the other surface, and the side face, and said semiconductor chip has the side face, one main surface of said semiconductor chip being in contact with the other main surface of said first heat buffer plate, the other main surface of said semiconductor chip being in contact with the other main surface of said second heat buffer plate, and said creepage distance being produced in such a manner that part of the side face and part of the other main surface of said first heat buffer plate, the side face and part of the other main surface of said semiconductor chip, and part of the side face of said second heat buffer plate face the surface of said chip frame.

19. An internal compression bonded semiconductor device according to claim 18, wherein said chip frame has three cutaway sections of different shapes in the direction of thickness, the cutaway sections being composed of a first cutaway section that fits on the side face of said first heat buffer plate, a second cutaway section that fits on the side face of said semiconductor chip, and a third cutaway section that fits on the side face of said second heat buffer plate.

20. An internal compression bonding semiconductor device according to claim 19, wherein the peripheral shape of said chip frame is formed so as to fit in the inner wall of said case.

* * * * *

UNITED STATES PATENT AND TRADEMARK OFFICE
CERTIFICATE OF CORRECTION

PATENT NO. : 5,760,425
DATED : June 2, 1998
INVENTOR(S) : Ikuko KOBAYASHI, ET AL.

It is certified that error appears in the above-identified patent and that said Letters Patent is hereby corrected as shown below:

On the title page, in Item [73], the Assignee's name is incorrect. It should read:

--Kabushiki Kaisha Toshiba--

Signed and Sealed this

First Day of December, 1998

Attest:

BRUCE LEHMAN

Attesting Officer

Commissioner of Patents and Trademarks